United States Patent

Ormond

[15] 3,668,690

[45] June 6, 1972

[54] METHOD AND APPARATUS FOR ANALOG TO DIGITAL CONVERSION

[72] Inventor: Alfred Newman Ormond, 11969 East Rivera Road, Santa Fe Springs, Calif.

[22] Filed: June 8, 1970

[21] Appl. No.: 44,245

[52] U.S. Cl. ..................................340/347 NT, 340/347 CC

[51] Int. Cl. ..........................................................H03k 13/02

[58] Field of Search ..............................340/347 CC, 347 NT

[56] References Cited

UNITED STATES PATENTS

| | | | |
|---|---|---|---|
| 3,445,839 | 5/1969 | Engleberg | 340/347 CC |
| 3,544,895 | 12/1970 | Richman | 340/347 CC |
| 3,500,196 | 3/1970 | Cooper | 340/347 CC |

OTHER PUBLICATIONS

Velasevic, Drift Elimination In Integrating A to D coverters, Electronic Engineering March 1970 Vol. 42, No. 505.

*Primary Examiner*—Maynard R. Wilbur
*Attorney*—Pastoriza & Kelly

[57] ABSTRACT

An analog voltage signal is converted to a digital output reading by applying it to a variable frequency oscillator, the output frequency of which is proportional to the applied signal. Initially, the oscillator is set to oscillate at a given reference frequency for zero voltage input signals. The analog signal is then applied to the oscillator for a first given time interval. The output of the oscillator is counted by an up-down counter during this first period to provide a count proportional to the sum of the reference frequency and frequency resulting from the analog signal. The input applied to the oscillator is then changed to either zero volts or the reversed polarity of the analog signal during a second given time interval and the direction of the counter is changed to count the output of the oscillator in a down direction during this second time interval. The resulting counting total after the first and second time intervals registered in the counter is then directly proportional to the value of the analog signal, the count from the reference frequency having been subtracted out over the two time intervals. Any drift effects in the variable frequency oscillator are thus cancelled and a more accurate digital output reading corresponding to the analog signal results. Further features of the method and apparatus contemplate providing an output count in the form of a ratio of a number corresponding to the analog signal and a fixed number provided by a constant input signal so that a scaling factor is provided.

7 Claims, 8 Drawing Figures

INVENTOR.
ALFRED NEWMAN ORMOND
BY Pastoriza & Kelly
ATTORNEYS

INVENTOR.
ALFRED NEWMAN ORMOND
BY Pastoriza & Kelly
ATTORNEYS

METHOD AND APPARATUS FOR ANALOG TO DIGITAL CONVERSION

This invention relates generally to analog to digital conversion techniques and more particularly to an improved method and apparatus for converting an analog signal into a digital output wherein greater accuracy is realizable than has been possible heretofore.

BACKGROUND OF THE INVENTION

A common method of converting an analog type signal into a digital signal is to apply the analog signal to a variable frequency oscillator which in turn varies in frequency proportional to the applied signal. The output frequency is then counted for a set period of time and the total count provides a value equivalent to the applied signal. This method of digitizing a signal has many advantages primarily its simplicity. On the other hand, for zero or low values of the analog input signal, the oscillator has to oscillate at zero frequency or at a frequency very near zero. The proportionality factor between the applied input signal and the frequency of the output signal becomes unpredictable when the output frequency is at zero or near zero. Also, any changes in the oscillator frequency that result from zero drift or changes in the scale factor are reflected in the total count as an error. The zero drift and the span drift of the variable frequency oscillator then become vary significant factors in making accurate measurements.

BRIEF DESCRIPTION OF THE PRESENT INVENTION

The present invention contemplates a method and apparatus for analog to digital conversion utilizing a variable frequency oscillator but which is so designed that problems associated with zero or near zero frequencies for small input analog signals, changes in oscillator frequency resulting from zero drift or changes in scale factor, span drift, and undesirable external errors are all reduced or substantially eliminated to the end that greater accuracy is realizable in the digital output display.

Esentially, the method comprehends the steps of generating a reference frequency; varying the reference frequency by an amount constituting a function of the analog signal to provide a first modified frequency during a first given time interval; counting the total number of cycles of the first modified frequency in an up direction occurring during said first given time interval; changing the analog signal such that a second modified frequency is present during a second given time interval equal to said first given time interval; and counting the total number of cycles of the second modified frequency in a down direction occurring during said second given time interval, whereby a first counting total resulting after said first and second time intervals is equal to a factor $k$ times the value of the analog signal.

In a first instance, the analog signal is changed during the second time interval so that the second modified frequency corresponds with the initial reference frequency; that is, the analog signal is changed to a zero signal value. Under these circumstances, the factor $k$ is equal to 1.

In a second instance, the analog signal is changed in polarity to provide the second modified frequency during the second time interval so that the factor $k$ is equal to 2.

The method contemplates additional steps for providing an output constituting a ratio of counts providing a number proportional to the analog signal divided by a fixed number proportional to a constant input signal so that the span or sensitivity of the variable frequency oscillator can be cancelled by maintaining the ratio.

The apparatus for carrying out the method includes a basic variable frequency oscillator designed to oscillate at a fixed reference frequency for a zero voltage input signal and to vary in frequency from the fixed reference frequency in accord with the value of an analog input signal. Cooperating with this variable frequency oscillator is an up-down counter, interval timer means, first switch means operated by the interval timer, function selector means responsive to the interval timer for controlling the up-down counter, and suitable display means for displaying at the end of each cycle of operation the count in the up-down counter. The switch means operates in response to the initiation of the generation of a first given time interval by the timer means to apply the analog signal to the variable frequency oscillator and at the same time, the up-down counter is set to count in an up direction during this first given time interval. The switch means is then actuated in its reverse direction in response to initiation of the second given time interval by the timer means to apply either zero volts to the variable frequency oscillator or an inverse polarity of the analog signal during the second given time interval. Also, the up-down counter is changed to count in a down direction during this second time interval. The resulting count is then displayed. To provide a ratio output as described in conjunction with additional method steps, a second switch means is provided operable in response to the initiation of third and fourth time intervals by the timer means to provide a second total count corresponding to a constant input signal and this second total count together with the first total count is passed to a computer wherein the ratio of the counts is provided to the display means.

BRIEF DESCRIPTION OF THE DRAWINGS

A better understanding of the method and apparatus will be had by now referring to the accompanying drawings, in which.

DETAILED DESCRIPTION OF THE FIRST EMBODIMENT OF THE INVENTION

Figure 1:
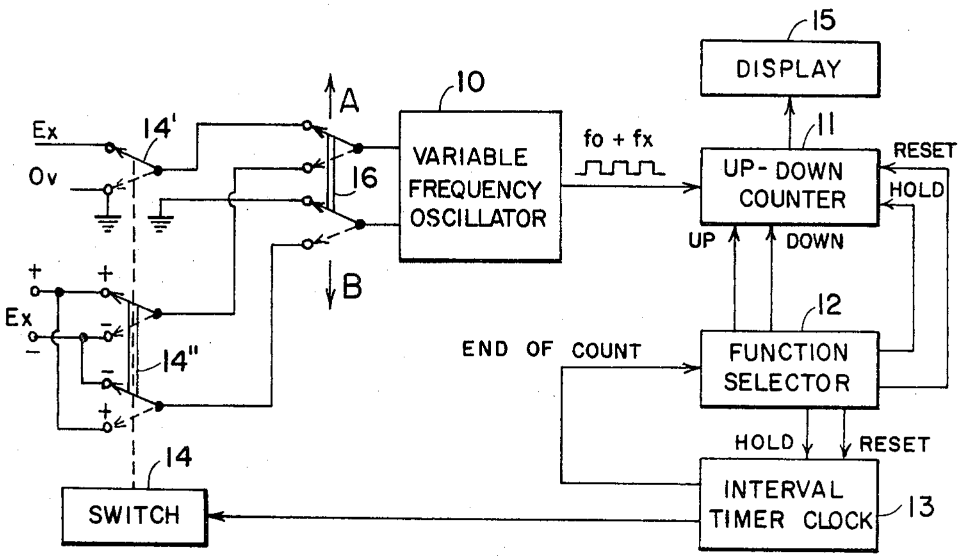
FIG. 1 is a block diagram of a first embodiment of the invention.

Referring to FIG. 1 there is illustrated by the center block 10 a variable frequency oscillator in which the output frequency varies with changes in an input voltage signal. In accord with a feature of this invention, the oscillator 10 is designed to provide a basic reference output frequency *fo* when no signal or a zero voltage signal is applied to its input.

As shown, the oscillator connects to an up-down counter 11. The counter is controlled by a function selector 12 in turn responsive to an interval timer clock 13 or equivalent suitable interval timer means for providing control signals at spaced time intervals. A first switch means 14 is also responsive to the interval timer 13 as indicated by the connecting line for controlling a switch schematically indicated by the switch arm 14'. A display 15 is shown responsive to the up-down counter 11 for providing a numerical display corresponding to the counting total in the up-down counter.

The circuit of FIG. 1 includes a double throw switch 16 shown in an up or A position. In this position, the circuit is operated in one mode. The switch 16 may also be thrown to a down B position to operate the circuit in a second mode.

OPERATION OF THE FIRST EMBODIMENT OF THE INVENTION

In operation, assume that the analog voltage whose value is to be converted into a digital display is represented by the voltage $E_x$ shown applied to the upper contact for the switch arm 14' in FIG. 1. Assume also that the double throw switch 16 is in the up or A position as shown in solid lines.

In starting the circuit, the switch arm 14' is thrown to its upper position by the switch means 14 in response to initiation of a first given time interval by the timer clock 13. During this first given time interval, the output from the variable frequency oscillator will constitute the sum of the reference frequency $f_0$ and an unknown frequency $f_x$ resulting from the analog signal $E_x$. The sum of these frequency signals pass to the up-down counter 11. This counter is set to count up from a zero position in response to initiation of the first given time interval through the function selector 12.

Figure 2:
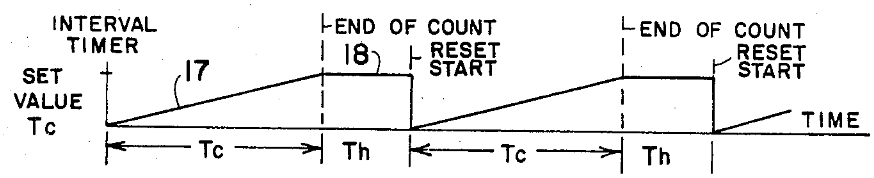
FIG. 2 is a timing diagram useful in explaining the operation of the interval timer of FIG. 1.

Referring to FIG. 2, this first given time interval is represented by the symbol $Tc$ during which time the up count takes place indicated by the line 17. At the end of the first given time interval, the count or line 17 stops as indicated by the level line 18 representing the end of the count. A small hold period represented by $Th$ is provided during which time the switch 14 is operated by the interval timer clock 13 and the up-down counter is set to count in a down direction. These events correspond with the initiation of a second given time interval designated $T_c$ equal to the first time interval $T_c$. At the end of the second time interval, the up-down counter is stopped at a point in time corresponding to the designated end of count. The switch 14 is then operated by the interval timer clock to its original up position to commence operation of a second complete cycle including the first and second time intervals.

Figure 3:
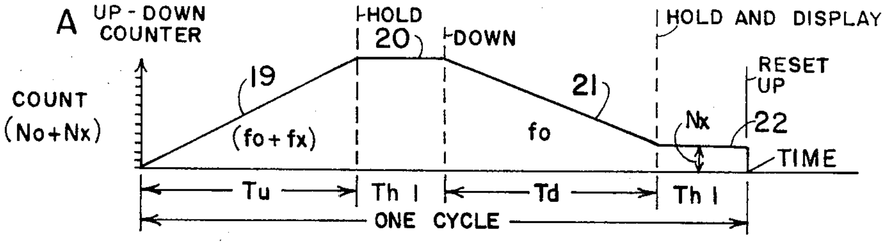
FIG. 3 is another timing diagram useful in explaining the operation of the up-down counter of FIG. 1 in a first mode of operation.

During the time intervals described in FIG. 2, the operation of the up-down counter itself is diagrammed in FIG. 3. Thus, the first given time interval is designated $Tu$ during which the counter is operated in an up count condition as indicated by the line 19. During this first interval, the sum of the frequencies $f_0+f_x$ is counted. During the period $Th1$ as schematically illustrated by the horizontal line 20, the accumulated count in the up-down counter is held. The second time interval is then initiated after the switch arm 14' has been thrown to the lower or zero volt terminal shown in FIG. 1. The up-down counter will then count in a down direction for the second time interval $Td$ as indicated by the line 21. Since a zero volt signal is applied to the variable frequency oscillator, the down count will be simply a count of the basic reference frequency $f_0$.

At the end of the second time interval, the updown counter is stopped and will hold the registered count as indicated by the line 22. It will be evident that this first counting total corresponds to a number of counts $N_x$ which corresponds to the frequency $f_x$ since the count $N_o$ corresponding to the reference frequency $f_o$ has been subtracted from the counter during the second down count interval. This first counting total represented by $N_x$ may be displayed on the display means 15 of FIG. 1.

After the first and second time intervals described in FIG. 3, the whole cycle is again repeated and the rate of repetition is such that the display 15 will appear continuous and will constitute a numerical value corresponding to the analog input signal $E_x$.

Figure 4:
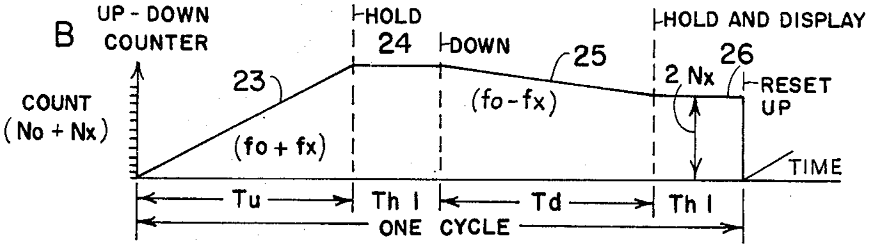
FIG. 4 is a diagram similar to FIG. 3 for a second mode of operation.

Consider now the operation of the circuit of FIG. 1 when the double throw switch 16 is in its down or B position. In this case, during the first time interval $T_u$ as illustrated in FIG. 4, the up-down counter will count the frequencies $f_o+f_x$ as indicated by the line 23. This count will be held in the up-down counter as indicated by the horizontal line 24 during the period $Th1$ and at the time of initiation of the second time interval $T_d$, the switch 14'' will be thrown to provide a reverse polarity of the analog signal $E_x$ to the variable frequency oscillator 10. Thus the output of the oscillator during the second time interval will constitute the difference between the reference frequency $f_o$ and the analog signal frequency $f_x$. The up-down counter will count down this difference frequency as indicated by the line 25 until the end of the second time interval. At this point, the net count held in the counter during the holding period indicated by the line 26 corresponds to twice the number of counts $N_x$ corresponding to the analog signal. This is because the quantity $f_o+f_x$ has subtracted from it during the down count the quantity $f_o-f_x$ the total result being a count corresponding to $+2f_x$. The actual number $2N_x$ is displayed on the display 15. Thereafter, the entire cycle including the first and second time intervals is repeated as in the case described in conjunction with FIG. 3 so that a continuous display of a number corresponding to twice the value of the analog signal $E_x$ results.

It should be noted that in the first mode of operation described in conjunction with FIG. 3 if the frequency $f_o+f_x$ during the first time interval is designated a first modified frequency and the frequency counted down during the second time interval is designated a second modified frequency, when the double throw switch arm 16 is in the up or A position, this second modified frequency corresponds to the reference frequency $f_o$ whereas when the double throw switch arm 16 is in the down or B position this second modified frequency constitutes the difference between the reference frequency and the frequency resulting from application of an inverted polarity of the analog signal. In both cases, the numerical display on the display 15 is equal to $k$ times the value of the analog input signal where the proportionality factor $k$ is equal to 1 in the case of FIG. 3 and 2 in the case of FIG. 4.

In the FIG. 3 mode of operation wherein the switch arm 16 of FIG. 1 is in the up or A position, there results a direct relationship between the applied signal $E_x$ and the digitized counts $N_x$ even though the variable frequency oscillator 10 is oscillated at a center frequency $f_o$ considerably higher than the frequency $f_x$ resulting from the analog signal. Any changes in the center frequency $f_o$ resulting from drift are substantially cancelled since such change during the up count will be the same substantially as during the down counts so that an effective cancellation occurs particularly when the whole cycle of operations occurs at a rapid repetition rate.

The use of this type of digital conversion permits the difference between large numbers to be measured within the accuracy of 1 cycle of the variable frequency oscillator 10. If the center or reference frequency $f_o$ is very high, for example in the megacycle region, then the errors due to starting and stopping the counter and changing from the up to the down conditions will be negligible. The counter can be started and stopped in nanoseconds when integrated circuits are used as timing and counting components.

The above same advantages obtain in the mode of operation described in conjunction with FIG. 4. However, rather than a zero volt reference signal during the second time interval, the input analog is simply inverted to accomplish essentially the same function. By taking the differential of the positive and negative applied voltage, temperature and other effects in the external circuitry are effectively cancelled.

DETAILED DESCRIPTION OF THE SECOND EMBODIMENT OF THE INVENTION

Figure 5:
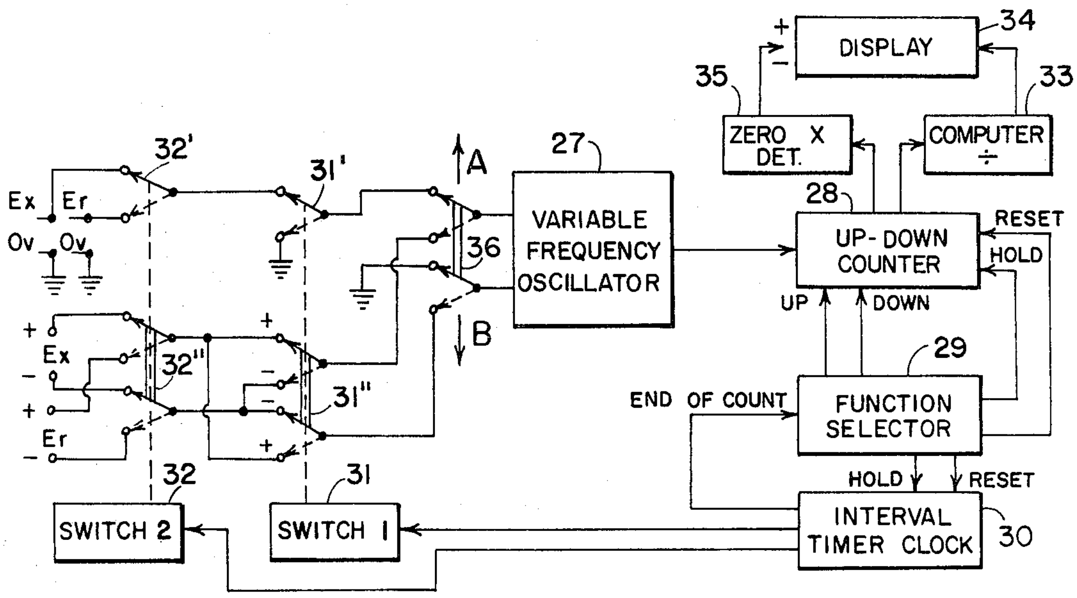
FIG. 5 is a block diagram illustrating a second embodiment of the invention.

Referring now to FIG. 5 there is shown a second embodiment of the invention in which not only are zero drift and reference or center frequency values cancelled but also a desired scale relationship may be established between the unknown analog $E_x$ and a constant input reference signal $E_r$. Thus any drift or scale factor changes are eliminated in the analog digital conversion process.

As in the case of the embodiment of FIG. 1, there is provided a variable frequency oscillator 27 having its output connected to an up-down counter 28 in turn controlled by a function selector 29. An interval timer clock 30 is connected to the function selector 29 as shown and also controls first and second switch means 31 and 32. Corresponding switch arms 31' and 32'' are thrown in response to operation of the first switch means 31 and corresponding switch arms 32' and 32'' are thrown in response to operation of the second switch means 32.

Rather than feed the output from the up-down counter directly to a display as in FIG. 1, the output is passed to a computer 33 which in turn connects to a display means 34. In addition, a zero cross-over detector 35 may be provided connected to the up-down counter 28 and arranged to provide a negative sign to the reading on the display 34 in response to the up-down counter passing a zero count position. In this respect, the zero cross-over detector would reverse the operation of the up-down counter to an up count condition at the same time that the negative sign were applied to the numerical reading on the display 34. A double throw switch arm 36 is provided for the variable frequency oscillator 27 to enable first and second modes of operation to take place.

OPERATION OF THE SECOND EMBODIMENT OF THE INVENTION

Figure 6:
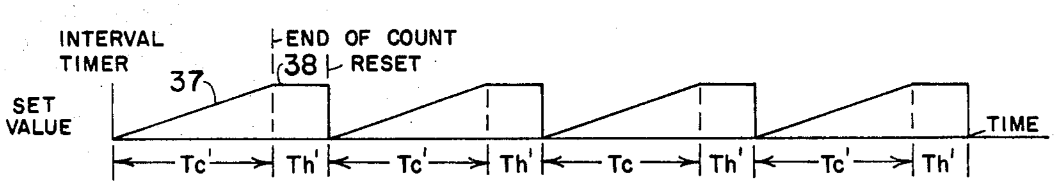
FIG. 6 is a timing diagram useful in explaining operation of the interval timer in FIG. 5.

In the operation of the circuit of FIG. 5, the interval timer clock 30 provides first, second, third, and fourth time intervals as indicated by the saw-toothed line 37 in FIG. 6. These time intervals are all of equal duration as shown at $T_c'$ and are separated by short duration holding intervals $T_h'$ during the period defined by the line 38.

Figure 7:
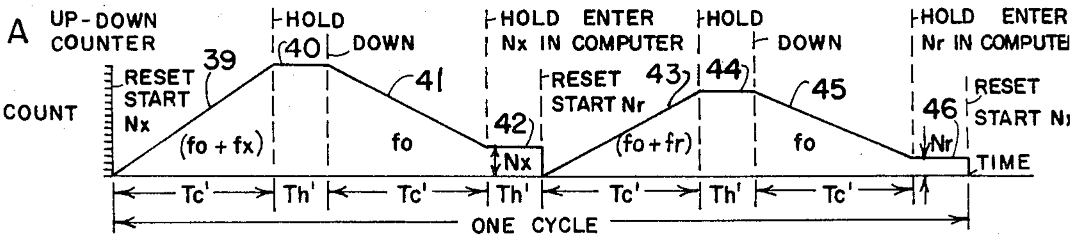
FIG. 7 is another timing diagram useful in explaining a first mode of operation of the up-down counter of FIG. 5; and, FIG. 8 is a timing diagram useful in explaining second mode of operation of the up-down counter of FIG. 5.

Assume first that the double throw switch arms 36 are in the up or A position in FIG. 5. Referring to FIG. 7 at the initiation of the first timing interval $T_c'$ the switch arms 31′ and 32′ will be in their solid line position as shown so that the analog voltage $E_x$ is applied to the variable frequency oscillator 27. The up-down counter will then count the sum of the reference frequency $f_o$ and $f_x$ as indicated by the line 39 to the end of the first time interval at which point the up-down counter will hold the count as indicated at 40 in FIG. 7. The switch arm 31′ operable by the first switch means 31 is then actuated to its down position wherein a ground or zero voltage is applied to the variable frequency oscillator 27 and the up-down counter is changed to a down count condition. The output of the variable frequency oscillator then corresponds to the standard reference frequency $f_o$ and this count takes place as indicated at 41 and is terminated at the line 42 corresponding to the end of the second time interval. The first totalling count in the counter 28 at the end of the second time interval is indicated by $N_x$. Thus far, the operation is the same as that described with respect to the embodiment of FIG. 1. However, rather than display the count $N_x$, the count itself is stored or held in the computer 33 of FIG. 5 and the counter then resets. At this point, the switch means 32 of FIG. 5 is actuated during the hold period between the end of the second time interval and start of the third time interval to lower the switch arm 32′ and simultaneously the switch means 31 is operated to return the switch arm 31′ to its initial position shown in FIG. 5. When the switches are in this position, a constant input reference voltage $E_r$ is applied to the variable frequency oscillator 27 and the up-down counter 28 will then commence counting up the sum of the reference frequency $f_o$ and the frequency $f_r$ resulting from application of this constant input voltage signal. This count during the third time interval is indicated by the line 43 in FIG. 7 and will be held in the counter at the end of the third time interval as indicated by the line 44. The first switch means 31 is then actuated to again apply zero volts to the variable frequency oscillator 27 during the fourth time interval so that the counter will count down only the standard frequency $f_o$ as indicated at 45. There then results in the counter a number of counts $N_r$ which corresponds to the constant input signal $E_r$. This number of counts is then transferred to the computer 33 during the hold period 46.

The computer 33 of FIG. 5 then divides the first counting total by the second counting total so that the display 34 will indicate a ratio corresponding to a number proportional to the analog signal $E_x$ divided by a fixed number proportional to the constant input reference signal $E_r$. The various switches are then reset along with the up-down counter and the entire cycle during the four time intervals is repeated so that a repetitive display of the referred to ratio occurs on the display means.

If now the double throw switch 36 of FIG. 5 is moved to its down or B position, the circuit will operate in a second mode similar to the nammer described for FIG. 5 in conjunction with FIG. 4. Thus, rather than utilizing a zero input voltage to subtract out the reference frequency during the down count periods in the second and fourth time intervals, a reverse polarity signal for the analog signal $E_x$ is provided during the second period and a reverse polarity constant input signal $E_r$ is provided during the fourth period.

Figure 8:
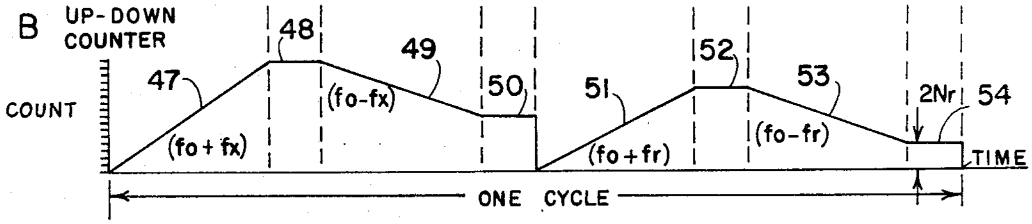

The counting and holding periods during the four cycles are depicted in FIG. 8 by the numerals 47, 48, 49, 50, 51, 52, 53, and 54. The resulting first counting total and second counting total will reflect values twice that of the analog signal and reference signal respectively but since a ratio is provided , the factor 2 will cancel so that there results a final display as described in conjunction with the operation in the first mode of FIG. 7.

The advantage of the mode of FIG. 8 is the same as that realized in the second mode described in conjunction with FIG. 4; that is, by utilizing an inversion of polarity of the input signal errors due to temperature and the like occurring externally are cancelled.

In summary, the first embodiment of the invention assures that zero drift and center frequency value changes are substantially cancelled while the FIG. 2 embodiment assures that in addition to cancellation of zero drift and center frequency values any drift or scale factor changes in the analog to digital conversion process is eliminated.

While mechanical type switch arms have been shown in the drawings, such showings are merely for illustrative purposes. It will be understood by those skilled in the art that electronic switching techniques would be employed. Further, while an up-down counter has been depicted as performing adding and subtracting functions, other types of circuit elements such as add and subtract registers could be used. Insofar as the interval timing operation is concerned, analog type elements such as RC networks could be used. However, best results are obtained by utilizing a fixed frequency oscillator and counter as the circuit elements to define the time intervals.

It should be understood in conjunction with the overall discriptions that for proper operation the timing intervals during which an up count is taking place must correspond exactly to the timing interval during which the down count takes place. Only by making these time intervals equal can the desired result of an accurate digital display corresponding to the analog input signal be realized.

What is claimed is:

1. A method of converting an analog signal to a digital signal comprising the steps of:

a. generating a reference frequency;

b. adding to said reference frequency a frequency constituting a function of said analog signal to provide a first modified frequency during a first given time interval;

c. counting the total number of cycles of said first modified frequency in an up direction occuring during said first given time interval;

d. subtracting from said reference frequency said frequency constituting a function of said analog signal such that a second modified frequency is present during a second given time interval equal to said first given time interval; and e. counting the total number of cycles of said second modified frequency in a down direction occuring during said second given time interval, whereby a first counting total resulting after said first and second time intervals is equal to twice the value of said analog signal.

2. The method of claim 1, including the additional steps of holding said first counting total resulting after said first and second time intervals; and repeating the up and down counting operations with respect to a constant input signal during third and fourth time intervals equal to said first and second time intervals to provide a second counting total resulting after said third and fourth time intervals equal to $k'$ times the value of said constant input signal; and dividing said first counting total by said second counting total so that the resulting ratio provides a number proportional to said analog signal divided by a fixed number proportional to said constant input signal.

3. An apparatus for converting an analog signal to a digital signal comprising, in combination:

a. a variable frequency oscillator providing an output reference frequency when zero input frequency is applied thereto;

b. an up-down counter connected to said oscillator to count the output frequency thereof;

c. an interval timer means;

d. first switch means connected to said interval timer means and responsive to the initiation of a first given time interval to apply said analog signal to said oscillator, and to the initiation of a second given time interval, equal to said first time interval, to apply the reversed polarity of said analog signal to said oscillator; and, e. function selector means responsive to said interval timer means for controlling operation of said first time interval so that the sum of said reference frequency and frequency resulting from said analog signal is counted in an up direction, and the difference between said reference frequency and frequency resulting from said analog signal is counted in a down direction only during said second given time interval, whereby a first counting total resulting after said first and second time intervals is registered in said up-down counter equal to twice the value of said analog signal.

4. An apparatus according to claim 7, including a second switch means connected to said interval timer means and responsive to the initiation of a third given time interval to apply a constant input signal to said oscillator and to initiation of a fourth given time interval to apply a second modified signal to said oscillator, said function selector means being responsive to said interval timer means for controlling operation of said up-down counter to count in an up direction only during said third time interval and in a down direction only during said fourth time interval so that a second counting total resulting after said third and fourth time intervals is registered in said up-down counter equal to $k'$ times the value of said constant input signal; computer means for receiving said first counting total from said up-down counter, said function selector means resetting said up-down counter after said first and second time intervals, said computer means receiving said second counting total after said third and fourth time intervals and including means for dividing said first counting total by said second counting total; and display means connected to said computer means for displaying a number proportional to said analog signal divided by a fixed number proportional to said constant input signal.

5. An apparatus according to claim 3, including display means connected to said up-down counter for displaying said first counting total after said first and second time intervals, said function selector means resetting said up-down counter after each second time interval to define a cycle of operation, said cycle being repeated at a sufficient rate to provide a visually continuous display of a number corresponding to the value of said analog signal.

6. An apparatus according to claim 4, in which said function selector means resets said up-down counter after each fourth time interval to define a cycle of operation, said cycle being repeated at a sufficient rate to provide a visually continuous display of the number proportional to said analog signal divided by said fixed number proportional to said constant input signal.

7. An apparatus according to claim 6, including a zero zero-cross-over detector connected to said up-down counter and responsive to the counter passing through zero to change the direction of counting from down to up and at the same time display a negative sign on said display means.

* * * * *